United States Patent [19]

Allen

[11] 4,297,593
[45] Oct. 27, 1981

[54] GLITCH ELIMINATOR CIRCUIT FOR TTL TRANSPARENT LATCH

[75] Inventor: Gordon H. Allen, Mesa, Ariz.

[73] Assignee: Motorola, Inc., Schaumburg, Ill.

[21] Appl. No.: 128,773

[22] Filed: Mar. 10, 1980

[51] Int. Cl.³ .......................................... H03K 17/56
[52] U.S. Cl. ............................. 307/247 R; 307/456; 307/542
[58] Field of Search ................ 307/214, 247 R, 542, 307/544, 546, 456, 290

[56] References Cited
U.S. PATENT DOCUMENTS
4,093,878  6/1978  Paschal et al. ................... 307/247 R

*Primary Examiner*—Harold A. Dixon
*Attorney, Agent, or Firm*—Vincent B. Ingrassia

[57] ABSTRACT

A TTL transparent latch circuit includes an input transistor having a base coupled to an input data signal and having emitter and collector terminals coupled respectively to the emitter and collector terminals of a latching transistor. A latch disabling signal is also coupled to the base of the input transistor which, when high, places the circuit in a transparent mode. An inverting gate inverts a latch enabling signal to form the latch disabling signal. The emitter of an additional transistor is coupled to the enabling signal, and the collector of the additional transistor is coupled to the base of the latching transistor. The base of the additional transistor is coupled to a source of supply voltage and to the output of the inverting gate. In this manner, the latching transistor is turned off simultaneously with turning the input transistor on.

11 Claims, 2 Drawing Figures

GLITCH ELIMINATOR CIRCUIT FOR TTL TRANSPARENT LATCH

BACKGROUND OF THE INVENTION

1. Field of the Invention

This invention relates generally to latching circuits and, more particularly, to a circuit for eliminating undesirable output excursions in a transparent TTL latch.

2. Description of the Prior Art

As is well known, a transparent latch is one which can be operated in both a transparent mode and a latching mode. In the transparent mode, data is permitted to flow freely (transparently) from the input to the output. In the latched mode, a data sample is latched or effectively stored within the circuit and is made available at the latch output. Subsequent changes in data state at the circuit input will not thereafter affect the output. Such transparent latches are well known in the art and are embodied in, for example, TTL latches bearing part number 74LS373 manufactured by Texas Instruments and Motorola.

During operation, a serious problem arises in that undesirable positive excursions or glitches appear at the output when the mode of the circuit is being changed from the latched mode to the transparent mode and a high logic level signal is present at the circuit input. These positive excursions or glitches can be disruptive to the operation of the system in which the transparent latch circuit is used.

SUMMARY OF THE INVENTION

It is an object of the present invention to provide an improved TTL transparent latch circuit.

It is a further object of the present invention to provide a TTL transparent latch circuit which is implemented so as to avoid undesirable output voltage excursions or glitches.

Finally it is an object of the invention to provide an improved TTL transparent latch wherein unwanted voltage excursions at the output are avoided by delaying a latch disabling signal which switches the mode of the latch circuit from a latching mode to a transparent mode.

According to an aspect of the invention there is provided a latch circuit capable of operating in a transparent mode or a latching mode and having an input terminal for receiving an input data signal which may assume high or low voltage levels and having an output terminal, comprising: an input transistor having base, emitter and collector terminals, said base terminal coupled to said input terminal; a latching transistor having base, emitter and collector terminals, the emitter and collector terminals of said latching transistor being coupled to the emitter and collector terminals respectively of said input transistor, the collector terminals of both said input and said latching transistors being coupled to said output terminal; a first source of a latch disabling signal coupled to the base of said input transistor, said latch disabling signal capable of assuming high or low voltage levels for placing said latch circuit in the transparent mode when said latch disabling signal is high; a second source of a latch enabling signal for enabling said latching transistor, said latch enabling signal capable of assuming high or low voltage levels for placing said latch circuit in the latching mode when said latch enabling signal is high, said latch enabling signal occurring prior to said latch disabling signal; and means for synchronizing said latch disabling signal with said latch enabling signal so as to turn said input transistor on substantially simultaneously with turning said latching transistor off when said input data signal is high.

According to a further aspect of the invention there is provided a latch circuit capable of operating in a transparent mode or a latching mode and including an input transistor for receiving an input data signal which may assume a high or low voltage level and a latching transistor coupled to said input transistor, comprising: a source of latch disabling signal; and means for delaying said latch disabling signal when shifting said circuit from said latching mode to said transparent mode when said input data signal is at a high voltage level.

The above and other objects, features and advantages of the present invention will be more clearly understood from the following detailed description taken in conjunction with the accompanying drawings, in which:

DESCRIPTION OF THE PREFERRED EMBODIMENT

Figure 1:
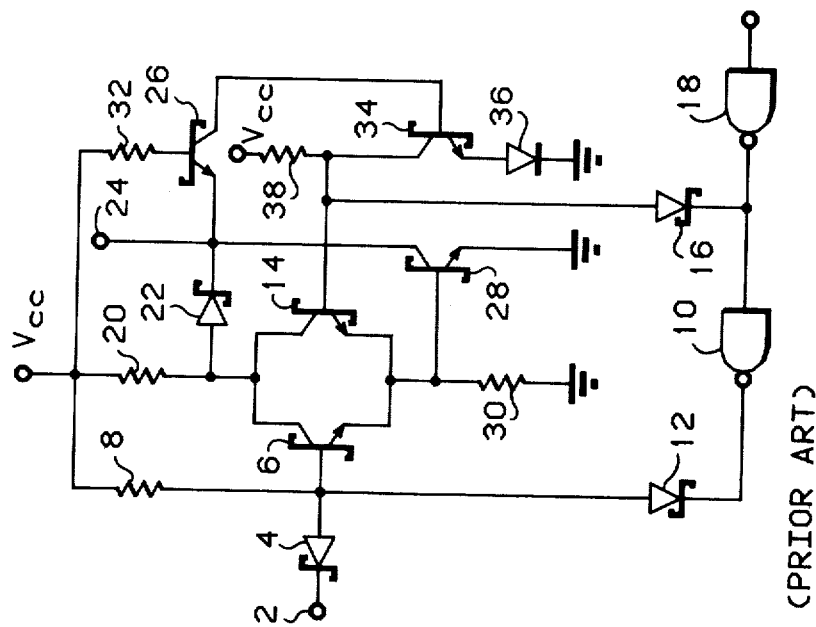
FIG. 1 is a schematic diagram of the input stage of a standard TTL transparent latch in accordance with the prior art.

To achieve a proper understanding of the invention, it is necessary to first describe the operation of the input stage of a TTL transparent latch circuit according to the prior art. Such a circuit is shown in FIG. 1. An input terminal 2 is coupled via Schottky diode 4 to the base of an input transistor 6 (a first Schottky transistor). It is to be noted that a Schottky transistor may comprise an ordinary bipolar transistor with a Schottky diode placed between its base and collector. The anode of diode 4 and the base of transistor 6 are coupled to a source of supply voltage $V_{CC}$ via resistor 8 and to the output of an inverting gate 10 via Schottky diode 12. While inverting gate 10 is shown as a single input NAND gate, it is to be understood that other forms of inverting circuitry may be utilized. The collector and emitter terminals of transistor 6 are coupled to the collector and emitter electrodes respectively of latching transistor 14 (a second Schottky transistor), the base of which is coupled via Schottky diode 16 to the output of inverting gate 18. The input of inverting gate 18 is coupled to a LATCH DISABLE signal which is capable of assuming first and second voltage levels (high and low). The output of inverting gate 18 which represents a source of a latch enabling signal forms the input to inverting gate 10.

The common collectors of transistors 6 and 14 are coupled, via resistor 20, to the source of supply $V_{CC}$ and, via Schottky diode 22, to an output terminal 24. Output terminal 24 is also coupled to the emitter of a third Schottky transistor 26 and to the collector of a fourth Schottky transistor 28 the emitter of which is coupled to ground. The common emitters of transistors 6 and 14 are coupled to the base of transistor 28 and, via resistor 30, to ground.

The base of transistor 26 is coupled, via resistor 32, to the source of supply $V_{CC}$, and the collector of transistor 26 is coupled to the base of a fourth Schottky transistor 34. The emitter of transistor 34 is coupled to ground via diode 36. The collector of transistor 34 is coupled to the source of supply ($V_{CC}$) via resistor 38. The collector of transistor 34 is likewise coupled to the base of transistor 14 and to the output of inverting gate 18 via Schottky diode 16.

The circuit shown in FIG. 1 operates as follows. When the LATCH DISABLE signal at the input of inverting gate 18 is high, latching transistor 14 is maintained in an off state since its base drive is diverted through diode 16 to a low voltage level at the output of inverting gate 18. This condition represents the transparent mode of operation. That is, data which appears at input terminal 2 will pass freely or transparently, although inverted, to output terminal 24. That is, if a low logic level signal is present at input terminal 2, transistor 6 remains in an off state since current flowing through resistor 8 is diverted through diode 4. With transistor 6 off, no current is supplied to the base of transistor 28. Thus, transistor 28 remains in an off state and output terminal 24 assumes a high logical level. If, on the other hand, the signal appearing at input terminal 2 were high, the current flowing through resistor 8 would provide base drive to input transistor 6 turning it on. This in turn would supply base drive to transistor 28 causing it to become conductive and to pull down output terminal 24 to a low state.

The latching mode of operation is initiated when the LATCH DISABLE signal at the input of inverter gate 18 goes low. Transistors 26 and 34 form a positive feedback path back to the base of transistor 14. When the output of inverting gate 18 goes from low to high, transistor 14 duplicates the existing conducting state of transistor 6. That is, if the existing conducting state of transistor 6 is off, then the base collector junction of transistor 26 is forward biased. This turns transistor 34 on, and current through resistor 38 is diverted through transistor 34 and diode 36. Thus, no base drive is supplied to the base of latching transistor 14 maintaining it in the off state.

If, on the other hand, the data signal at terminal 2 were in a high state when the LATCH DISABLE signal went low, transistor 6 would initially be on. With transistor 6 on, transistor 28 would be on as described earlier resulting in a low logic level signal at output terminal 24. In this case, the base emitter junction of transistor 26 would be turned on; thus transistor 34 is turned off. With transistor 34 off, when the output of inverting gate 18 goes from low to high, base drive is supplied to the base of transistor 14 through resistor 38 turning transistor 14 on and again duplicating the conductive state of transistor 6. After the propagation delay through inverting gate 10 has expired, its output will assume a low logic level causing base drive to transistor 6 to be diverted through diode 12 turning off transistor 6. However, this will not effect the conductive state of transistor 14 and it will remain on which in turn keeps transistor 28 on and the output level at terminal 24 low.

A problem occurs in the operation of the above described circuit when the LATCH DISABLE signal again goes high and the voltage appearing at input terminal 2 is likewise high. This is due to the finite propagation delay between the input and output of inverting gate 10. Specifically, the output of latch enabling inverting gate 18 (the input of latch disabling inverting gate 10) will go low a finite amount of time before the output of inverting gate 10 goes high. Thus, for a short time, both the input and output of inverting gate 10 are low. Transistor 14 will turn off since its base drive is now diverted through diode 16. Additionally, transistor 6 is off since its base drive is still being diverted through diode 12. With both transistors 6 and 14 off, their common collectors will rise in voltage until the output of inverting gate 10 again goes high turning transistor 6 on. This results in a short positive excursion or glitch at output terminal 24 which may be severely disruptive to any system in which the latch circuit is employed. It should be appreciated that no problem would exist if the existing state of input terminal 2 were low since the expected output under these conditions would normally be high.

Figure 2:
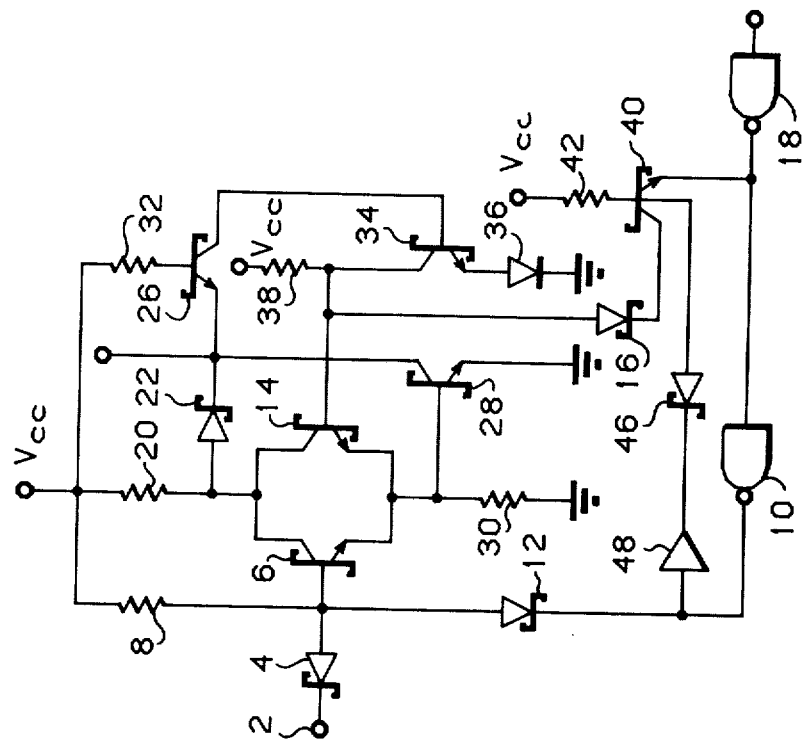
FIG. 2 is a schematic diagram of an input stage for a TTL transparent latch circuit in accordance with the present invention.

The inventive circuit shown in FIG. 2, in which like elements are denoted with like reference numerals, solves the above described problem through the addition of Schottky transistor 40, resistor 42 and Schottky diode 46. Additionally, the output of diode 16 is now coupled to the collector of transistor 40 instead of to the output of inverting gate 18. The base of transistor 40 is coupled via resistor 42 to the source of supply $V_{CC}$, and the emitter of transistor 40 is coupled to the output of inverting gate 18. The problem described above with respect to the prior art circuit is satisfactorily solved if Schottky diode 46 is coupled between the base of transistor 40 and the output of inverting gate 10. However, an additional margin of safety is provided by placing a non-inverting delay element 48 between the output of inverting gate 10 and the cathode of diode 46.

As described above, the problem with the prior art circuit shown in FIG. 1 occurs when a high input voltage is present at input terminal 2 and the LATCH DISABLE signal at the input of inverter gate 18 goes high to place the circuit in the transparent mode. This causes a low voltage to appear at the output of inverting gate 18. A low voltage already exists at the output of inverting gate 10 causing transistors 6 and 14 to be simultaneously in an off condition. Referring to the inventive circuit shown in FIG. 2, a low voltage level appears at the output of inverting gate 18 when the LATCH DISABLE signal goes high thus placing a low level at the emitter of transistor 40. The output of inverting gate 10 is already low since the circuit had been operating in the latching mode. Therefore, the base of transistor 40 is also low and there is no conduction at the collector of transistor 40. Therefore, base drive will continue to be supplied to the base of transistor 14 holding it on. When the output of inverting gate 10 finally does go high (after the propagation delay through inverting gate 10), the base of transistor 40 will go high turning transistor 40 on. This will divert base drive from the base of transistor 14. Simultaneously, base drive will be supplied to the base of transistor 6 due to the high voltage levels at input terminal 2 and at the output of inverting gate 10, and transistor 6 will turn on. The latch disabling signal has been synchronized with the latch enabling signal. Therefore, the situation where both transistors 6 and 14 are simultaneously off producing an undesirable output glitch has been avoided. A further measure of safety can be provided by placing a non-inverting delay element 48 between the cathode of diode 46 and the output of inverting gate 10 to further delay turning transistor 40 on. With transistor 14 suitably in the off state, the circuit is again operating in the transparent mode.

It is now only necessary to show that the additions of transistor 40, resistor 42 and diode 46 are not disruptive to normal latching operation of the circuit. That is, it must be shown that transistor 14 can still be enabled at the proper time to achieve latching.

As already described, the circuit converts to the latching mode when the LATCH DISABLE signal at the input of inverting gate 18 goes low causing a high voltage level to appear at the output of inverting gate 18 and a low voltage level to appear at the output of inverting gate 10. However prior to this, (during a transparent mode) the output of inverting gate 18 is low and the output of inverting gate 10 is high. With the output of inverting gate 10 high, the base of transistor 40 is also high. When the output of inverting gate 18 goes high, the cathode or n-side of Schottky diode 16 is charged for a period of time corresponding to the propagation delay through inverting gate 10. Thus, with the outputs of inverting gates 10 and 18 both high, the base of transistor 14 goes high. When the output of inverting gate 10 finally goes low, transistor 40 is disabled but this will not prevent transistor 14 from turning on if required due to the passive pull-up resistor 38 which completes the charging of the base of transistor 14 sufficiently so as to cause it to turn on. Thus, the circuit has satisfactorily been latched.

The above description of a preferred embodiment is given by way of example only. Changes in form and details may be made by one skilled in the art without departing from the scope of the invention as defined by the appended claims.

I claim:

1. A latch circuit capable of operating in a transparent mode or a latching mode and having an input terminal for receiving an input data signal which may assume high or low voltage levels and having an output terminal, comprising:

an input transistor having base, emitter and collector terminals, said base terminal coupled to said input terminal;

a latching transistor having base, emitter and collector terminals, the emitter and collector terminals of said latching transistor being coupled to the emitter and collector terminals respectively of said input transistor, the collector terminals of both said input and said latching transistors being coupled to said output terminal;

a first source of a latch disabling signal coupled to the base of said input transistor, said latch disabling signal capable of assuming high or low voltage levels for placing said latch circuit in the transparent mode when said latch disabling signal is high;

a second source of a latch enabling signal for enabling said latching transistor, said latch enabling signal capable of assuming high or low voltage levels for placing said latch circuit in the latching mode when said latch enabling signal is high, said latch enabling signal occurring prior to said latch disabling signal; and means for synchronizing said latch disabling signal with said latch enabling signal so as to turn said input transistor on substantially simultaneously with turning said latching transistor off when said input data signal is high.

2. A latch circuit according to claim 1 wherein said synchronizing means includes an additional transistor having base, emitter and collector terminals, said emitter terminal coupled to said latch enabling signal, said collector terminal coupled to the base of said latching transistor and said base terminal coupled to said latch disabling signal and to said source of supply.

3. A latch circuit according to claim 2 wherein said latch enabling signal is the output of a first inverting gate, said latch disabling signal is the output of a second inverting gate and wherein said latch enabling signal forms the input to said second inverting gate.

4. A latch circuit according to claim 3 further including first diode having an anode coupled to the base of said additional transistor and a cathode coupled to said latch disabling signal.

5. A latch circuit according to claim 4 further including delay means coupled between the output of said second inverting gate and the base of said additional transistor so as to further delay turning on said additional transistor which in turn causes said latching transistor to turn off after said input transistor has turned on.

6. A latch circuit according to claim 5 wherein said additional transistor is a Schottky transistor.

7. A latch circuit according to claim 6 wherein said first diode is a Schottky diode.

8. A latch circuit according to claim 4 further including a positive feedback path coupled between the collectors of said input and latching transistors and the base of said latching transistor so as to cause the conductive state of said latching transistor to imitate the conductive state of said input transistor in the latching mode.

9. A latch circuit according to claim 8 further including a pull-down transistor having base, emitter and collector terminals, said base terminal coupled to the emitters of said input transistor and said latching transistor, said emitter coupled to ground and said collector coupled to said output terminal.

10. A latch circuit according to claim 8 wherein said positive feedback path includes a first transistor having base, emitter and collector terminals, said emitter terminal coupled to the collectors of said input transistor and said latching transistor and to said output terminal, and said base coupled to said source of supply; and a second transistor having base, emitter and collector terminals, said base coupled to the collector terminal of said first transistor, said emitter coupled to ground and said collector coupled to said source of supply voltage and to the base of said latching transistor.

11. A latch circuit capable of operating in a transparent mode or a latching mode and including an input transistor for receiving an input data signal which may assume a high or low voltage level and a latching transistor coupled to said input transistor, comprising:

a source of latch disabling signal: and means for delaying said latch disabling signal when shifting said circuit from said latching mode to said transparent mode when said input data signal is at a high voltage level.

* * * * *